(12) United States Patent
Cai et al.

(10) Patent No.: US 8,815,742 B2
(45) Date of Patent: Aug. 26, 2014

(54) METHODS OF FORMING BULK FINFET SEMICONDUCTOR DEVICES BY PERFORMING A LINER RECESSING PROCESS TO DEFINE FIN HEIGHTS AND FINFET DEVICES WITH SUCH A RECESSED LINER

(71) Applicants: GLOBALFOUNDRIES Inc., Grand Cayman (KY); International Business Machines Corporation, Armonk, NY (US)

(72) Inventors: Xiuyu Cai, Niskayuna, NY (US); Ruilong Xie, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Coporation, Armonk, NY (US)

( * ) Notice: Subject to any disclaimer, the term of this patent is extended or adjusted under 35 U.S.C. 154(b) by 36 days.

(21) Appl. No.: 13/711,813

(22) Filed: Dec. 12, 2012

(65) Prior Publication Data
US 2014/0159171 A1    Jun. 12, 2014

(51) Int. Cl.
*H01L 21/311* (2006.01)
*H01L 29/66* (2006.01)
*H01L 29/78* (2006.01)

(52) U.S. Cl.
CPC ........ *H01L 29/785* (2013.01); *H01L 29/66795* (2013.01)
USPC ............................ 438/700; 438/703; 438/706

(58) Field of Classification Search
CPC ................. H01L 29/66545; H01L 29/66795; H01L 29/78; H01L 21/823807; H01L 29/6659; H01L 29/4966
USPC .......................................... 438/700, 703, 706
See application file for complete search history.

(56) References Cited

U.S. PATENT DOCUMENTS

| | | | |
|---|---|---|---|
| 2010/0151640 A1* | 6/2010 | Huebinger et al. | 438/221 |
| 2010/0213539 A1* | 8/2010 | Masuoka et al. | 257/329 |
| 2010/0230757 A1* | 9/2010 | Chen et al. | 257/368 |
| 2011/0045648 A1* | 2/2011 | Knorr et al. | 438/296 |
| 2011/0260250 A1* | 10/2011 | Miller et al. | 257/347 |

\* cited by examiner

*Primary Examiner* — Michelle Mandala
(74) *Attorney, Agent, or Firm* — Amerson Law Firm, PLLC

(57) ABSTRACT

One method disclosed herein includes forming a conformal liner layer in a plurality of trenches that define a fin, forming a layer of insulating material above the liner layer, exposing portions of the liner layer, removing portions of the liner layer so as to result in a generally U-shaped liner positioned at a bottom of each of the trenches, performing at least one third etching process on the layer of insulating material, wherein at least a portion of the layer of insulating material is positioned within a cavity of the U-shaped liner layer, and forming a gate structure around the fin. A FinFET device disclosed herein includes a plurality of trenches that define a fin, a local isolation that includes a generally U-shaped liner that defines, in part, a cavity and a layer of insulating material positioned within the cavity, and a gate structure positioned around the fin.

13 Claims, 6 Drawing Sheets

US 8,815,742 B2

METHODS OF FORMING BULK FINFET SEMICONDUCTOR DEVICES BY PERFORMING A LINER RECESSING PROCESS TO DEFINE FIN HEIGHTS AND FINFET DEVICES WITH SUCH A RECESSED LINER

BACKGROUND OF THE INVENTION

1. Field of the Invention

Generally, the present disclosure relates to the manufacture of sophisticated semiconductor devices, and, more specifically, to various methods of forming 3D semiconductor devices, such as FinFET devices, by performing a liner recessing process to define the fin height of the FinFET device, and to a FinFET device that includes such a recessed liner structure.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

One process flow that is typically performed to form FinFET devices involves forming a plurality of trenches in the substrate to define the areas where STI regions will be formed and to define the initial structure of the fins. These trenches are typically formed in the substrate during the same process operation for processing simplicity. The trenches have a target depth that is sufficient for the needed fin height and deep enough to allow formation of an effective STI region. After the trenches are formed, a layer of insulating material, such as silicon dioxide, is formed so as to overfill the trenches. Thereafter, a chemical mechanical polishing (CMP) process is then performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

Some integrated circuit products contain FinFET devices that have a different fin pitch, i.e., different fin spacing. FIG. 1A schematically depicts an illustrative prior art integrated circuit product 10 at a point of fabrication wherein a plurality of trenches 12 have been formed in a bulk semiconducting substrate 14 by performing an etching process through a patterned hard mask layer 16, e.g., a patterned layer of silicon dioxide. The etching process results in the formation of a plurality of fins 20. The product 10 comprises a region 20N where the FinFET devices have fins with a relatively narrow fin pitch 22N, e.g., 20-50 nm, and another region 20W where the FinFET devices have fins with a relatively wide fin pitch 22W, e.g., 1 µm or more. These regions are typically spaced apart on the substrate 14.

FIG. 1B depicts the product 10 after the patterned hard mask layer 16 has been removed, a layer of insulating material 24, e.g., silicon dioxide, has been deposited so as to overfill the trenches and a CMP process has been performed on the layer of insulating material in an effort to planarize the upper surface of the layer of insulating material 24 with the upper surface of the fins 20. As a result of the relatively wider fin pitch in the area 20W, there may be more dishing 26 in the region 20W than in the region 20N having the narrower fin pitch.

FIG. 1C depicts the prior art product 10 at a point in fabrication wherein a timed etching process has been performed on the layer of insulating material 24 to reduce its thickness and thereby define a reduced-thickness layer of insulating material 24R. Typically, semiconductor manufacturers try to establish the final height of the fins for the FinFET devices by controlling this etching process and the resulting thickness of the reduced-thickness layer of insulating material 24R.

There are several problems with the aforementioned process of forming fins for FinFET semiconductor devices. More specifically, as depicted in FIG. 1C, such a process flow may produce fins with varying heights 28A, 28B and 28C across the substrate. Such variations in fin height are undesirable from a design, manufacturing and performance standpoint. For example, if the fin height on a FinFET device is less than the target fin height determined by the design process, the resulting FinFET device may not produce as large of drive current as is anticipated by the circuit designer and the circuit may not function as well as anticipated. Having fins with differing height levels can also make manufacturing more difficult in that it becomes more difficult to achieve a planar surface in subsequent processing operations.

Such differences in fin height may be the result, at least in part, of several factors. Since the etching process that is performed to recess the layer of insulating material 24R (see FIG. 1C) is a timed etching process, there are variations in the resulting thickness of the reduced-thickness layer of insulating material 24R. Another factor that contributes to this undesirable situation may be excessive dishing 26 of the layer of insulating material 24 during the CMP process depicted in FIG. 1B. As a result of such dishing 26, after the recess etch process is performed, the fins in areas where such dishing is present may have a fin height that is greater than the target fin height due to the reduction in thickness of the layer of insulating material 24 as a result of the excessive dishing. Additionally, the initial depth of the trenches 12 in the region 20N may be different than the depth of the trenches 12 in the region 20W due to the difference in fin pitch in those two regions.

Device manufacturers are under constant pressure to produce integrated circuit products with increased performance and lower production cost relative to previous device generations. Thus, device designers spend a great amount of time in an effort to maximize device performance while seeking ways to reduce manufacturing cost and improve manufacturing reliability. As it relates to 3D devices, device designers have spent many years and employed a variety of techniques in an effort to improve the performance capability and reliability of such devices.

The present disclosure is directed to various methods of forming 3D semiconductor devices, such as FinFET devices, by performing a liner recessing process to define the fin height of the FinFET devices, and to a FinFET device that includes such a recessed liner structure, that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming 3D semiconductor devices, such as FinFET devices, by performing a liner recessing process to define the fin height of the FinFET device, and to a FinFET device that includes such a recessed liner structure. In one example, the method disclosed herein includes performing at least one first etching process through a patterned hard mask layer to form a plurality of trenches in a semiconducting substrate so as to thereby define a fin, forming a conformal liner layer above the hard mask and in the trenches, forming a layer of insulating material in the trenches above the liner layer and removing portions of the layer of insulating material so as to expose portions of the liner layer. The method also includes performing at least one second etching process to remove portions of the liner layer and the hard mask layer, wherein the etching process results in a generally U-shaped liner positioned at a bottom of each of the trenches, performing at least one third etching process on the layer of insulating material to thereby define a reduced-thickness layer of insulating material, wherein at least a portion of the reduced thickness layer of insulating material is positioned within a cavity defined by the generally U-shaped liner layer, and forming a gate structure around a portion of said fin.

Another illustrative method disclosed herein for forming a FinFET device having a target final fin height includes forming a patterned hard mask layer above a semiconducting substrate, performing at least one first etching process through the patterned hard mask layer to form a plurality of trenches in the substrate, wherein the trenches define a fin, selecting, based upon the target final fin height, a target thickness for a conformal liner layer to be formed above the patterned hard mask layer and in the trenches and forming the conformal liner layer having the target thickness above the patterned hard mask layer and in the trenches. The method further includes forming a layer of insulating material in the trenches above the conformal liner layer, performing a process operation to remove portions of the layer of insulating material and to expose portions of the conformal liner layer, performing at least one second etching process to remove portions of the conformal liner layer and the patterned hard mask layer, wherein the etching process results in a generally U-shaped liner positioned at a bottom of each of the trenches and wherein the substantially U-shaped liner exposes a portion of the fin that corresponds to the final desired fin height, performing at least one third etching process on the layer of insulating material to thereby define a reduced-thickness layer of insulating material and forming a gate structure around a portion of the fin having the final desired fin height.

One illustrative FinFET device disclosed herein includes a plurality of trenches formed in a semiconducting substrate that define a fin, a local isolation region positioned in a bottom of each of the trenches, wherein the local isolation region includes a generally U-shaped liner that has a plurality of spaced apart generally upstanding vertically oriented legs that define, in part, a cavity and a layer of insulating material positioned within the cavity in the generally U-shaped liner, and a gate structure positioned around a portion of the fin.

BRIEF DESCRIPTION OF THE DRAWINGS

The disclosure may be understood by reference to the following description taken in conjunction with the accompanying drawings, in which like reference numerals identify like elements, and in which.

Figure 1A:
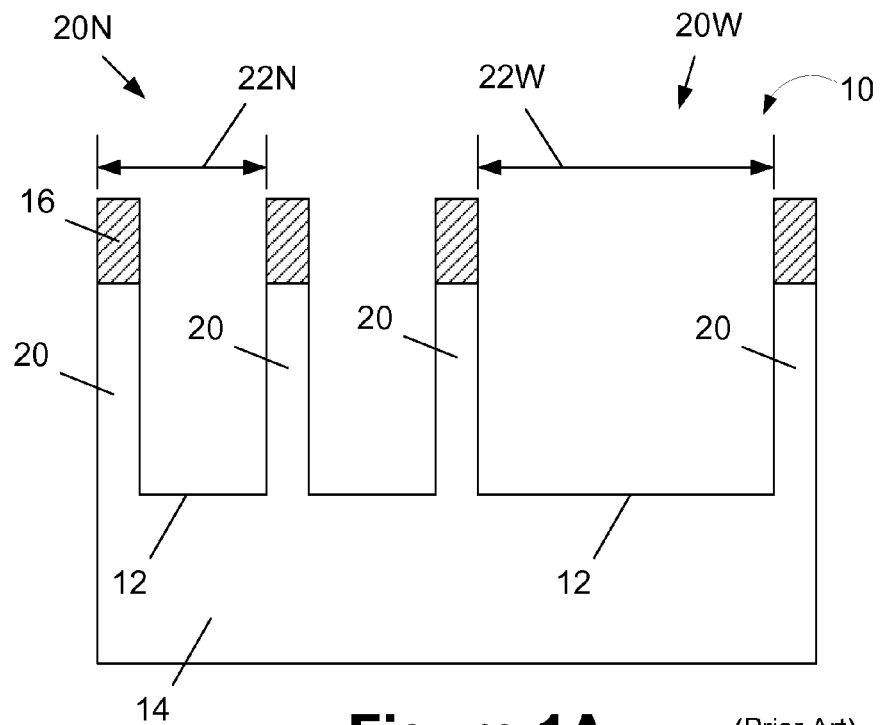
FIGS. 1A-1C depict one illustrative prior art method of forming fins for a FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to various methods of forming 3D semiconductor devices, such as FinFET devices, by performing a liner recessing process to define the fin height of the FinFET device, and to a FinFET device that includes such a recessed liner structure. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

Figure 1B:
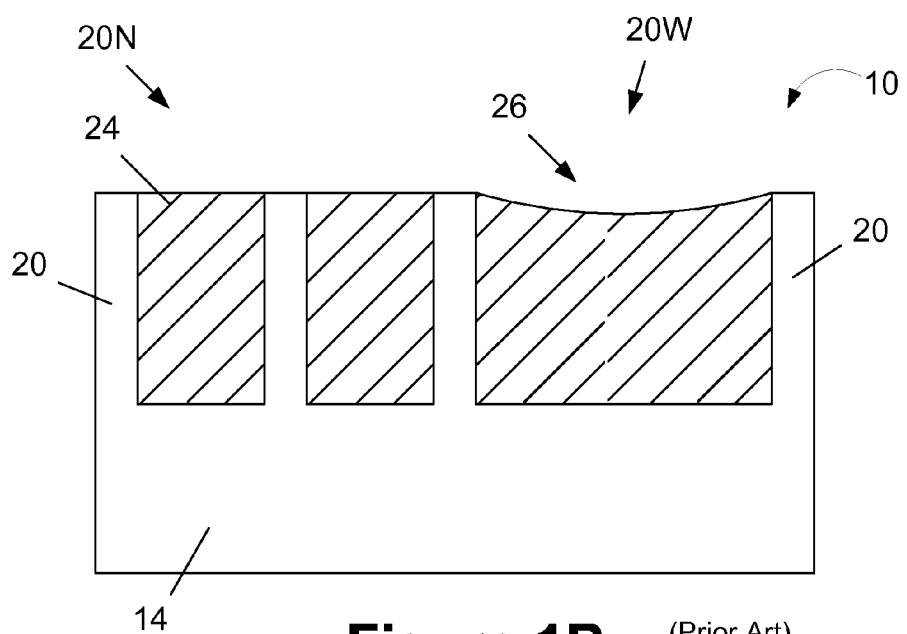
Figure 1C:
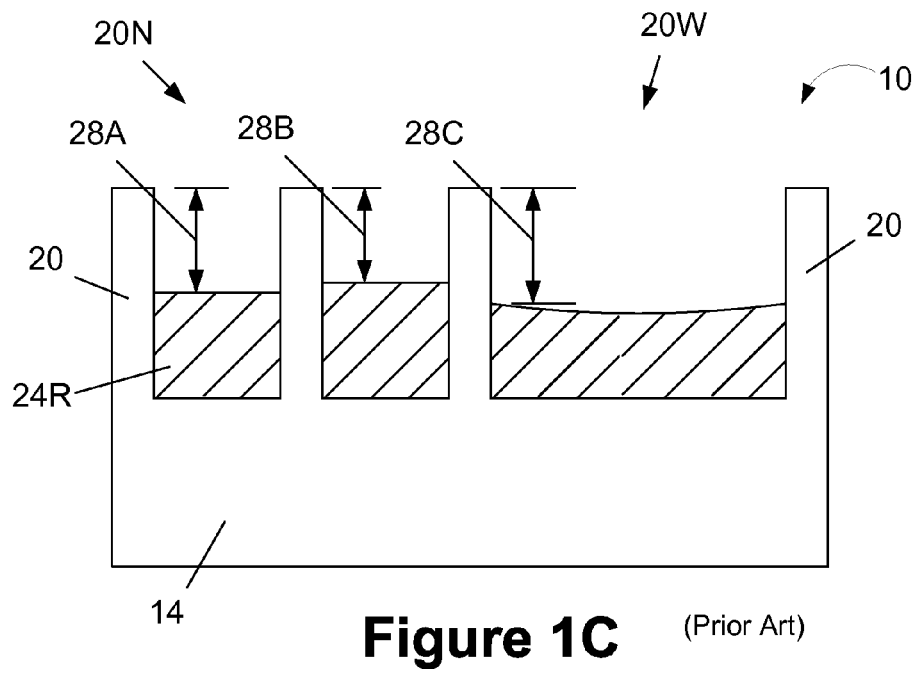
Figure 2A:
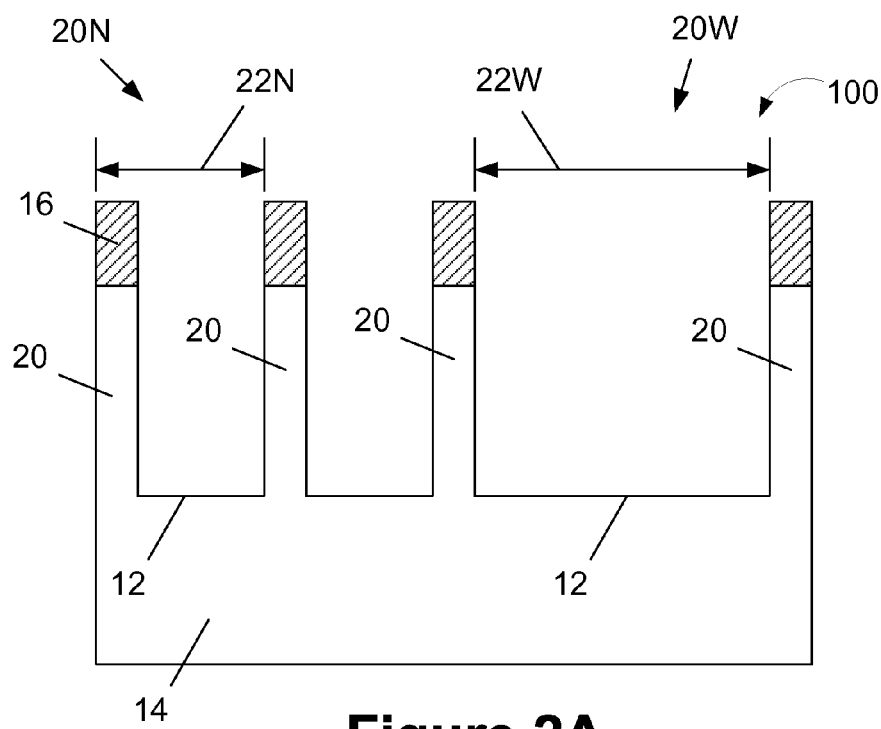
FIGS. 2A-2I depict various illustrative methods of forming an illustrative FinFET device by performing a liner recessing process to define the fin height of the FinFET device and the resulting device.

The point of fabrication depicted in FIG. 2A for the novel integrated circuit product 100 disclosed herein corresponds approximately to the point of fabrication depicted in FIG. 1A for the prior art product 10. FIGS. 2A-2I make use of some of the same reference numbers as previously discussed with respect to FIGS. 1A-1C and those numbers should be understood to refer to the same general structure as previously described, as supplemented herein.

FIG. 2A schematically depicts the novel integrated circuit product 100 at a point of fabrication wherein a plurality of trenches 12 have been formed in a bulk semiconducting substrate 14 by performing at least one etching process through a patterned hard mask layer 16, e.g., a patterned layer of silicon nitride. The etching process results in the formation of a plurality of fins 20. The product 100 comprises a region 20N where the FinFET devices have fins with a relatively narrow fin pitch 22N, e.g., 20-30 nm, and another region 20W where the FinFET devices have fins with a relatively wide fin pitch 22W, e.g., 1 µm or more. The regions 22N, 22W are typically spaced apart on the substrate 14 and each region may contain thousands (or more) of individual FinFET devices. However, as will be recognized by those skilled in the art after a complete reading of the present application, the inventions disclosed herein may be applied to the formation of a single FinFET device irrespective of whether or not the integrated circuit product 100 contains additional FinFET devices having a different fin pitch. Thus, the illustrative example of the product 100 having FinFET devices with different fin pitches should not be considered to be a limitation of the present invention.

The substrate 14 may have a variety of configurations, such as the depicted bulk substrate configuration. The substrate 14 may be made of silicon or it may be made of materials other than silicon. Thus, the terms "substrate" or "semiconducting substrate" should be understood to cover all semiconducting materials and all forms of such materials. Additionally, the overall size, shape and configuration of the trenches 12 and fins 20 may vary depending on the particular application. The depth and width of the trenches 12 may also vary depending upon the particular application. In one illustrative embodiment, based on current day technology, the depth of the trenches 12 may range from approximately 30-200 nm and the width of the trenches 12 may range from about 20-50 nm. In some embodiments, the fins 20 may have a width within the range of about 5-30 nm. In the illustrative examples depicted in most of the attached drawings, the trenches 12 and fins 20 are all of a uniform size and shape. However, as discussed more fully below, such uniformity in the size and shape of the trenches 12 and the fins 20 is not required to practice at least some aspects of the inventions disclosed herein. In most of the attached figures, the trenches 12 are formed by performing an anisotropic etching process that results in the trenches 12 having a schematically depicted, generally rectangular configuration. In an actual real-world device, the sidewalls of the trenches 12 may be somewhat inwardly tapered, although that configuration is not depicted in most of the attached drawings. In some cases, the trenches 12 may have a reentrant profile near the bottom of the trenches 12. To the extent the trenches 12 are formed by performing a wet etching process, the trenches 12 may tend to have a more rounded configuration or non-linear configuration as compared to the generally rectangular configuration of the trenches 12 that are formed by performing an anisotropic etching process. Thus, the size and configuration of the trenches 12, and the manner in which they are made, as well as the general configuration of the fins 20, should not be considered a limitation of the present invention. For ease of disclosure, only the substantially rectangular trenches 12 will be depicted in most of the subsequent drawings.

Figure 2B:
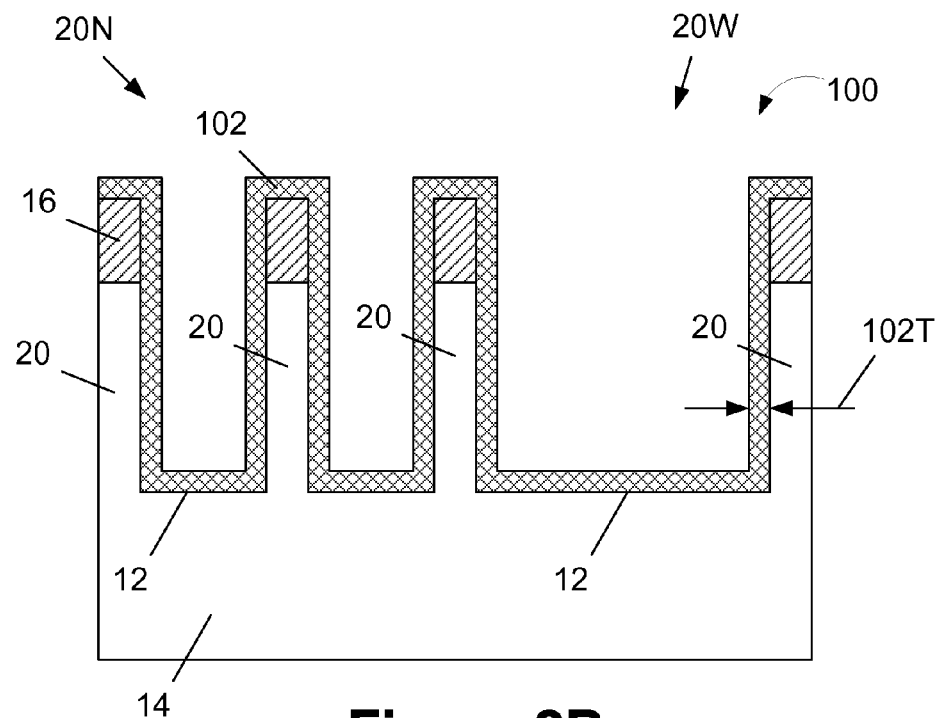

FIG. 2B depicts the product 100 after a conformal deposition process, e.g., a chemical vapor deposition (CVD) process, an atomic layer deposition (ALD) process, etc., has been performed to form a liner 102 on the product 100. More specifically, in the depicted example, the liner 102 is formed above the patterned hard mask layer 16, on the sidewalls of the fins 20 and in the trenches 12. The thickness 102T of the liner 102 may vary depending upon the particular application, e.g., it may have a thickness of about 5-10 nm. As described more fully below, using the processes described herein, the fin height of the fins of the FinFET devices are set by selecting the desired thickness 102T of the liner 102. In general, the liner 102 may be made of a material that may be selectively etched relative to the insulating material that will be used to fill the remaining portions of the trenches 12. For example, the liner 102 may be comprised of silicon nitride, silicon carbon nitride, silicon boron nitride, a doped nitride, silicon oxynitride, etc. In one particularly illustrative embodiment, both the patterned hard mask layer 16 and the liner 102 may be made of silicon nitride.

Figure 2C:
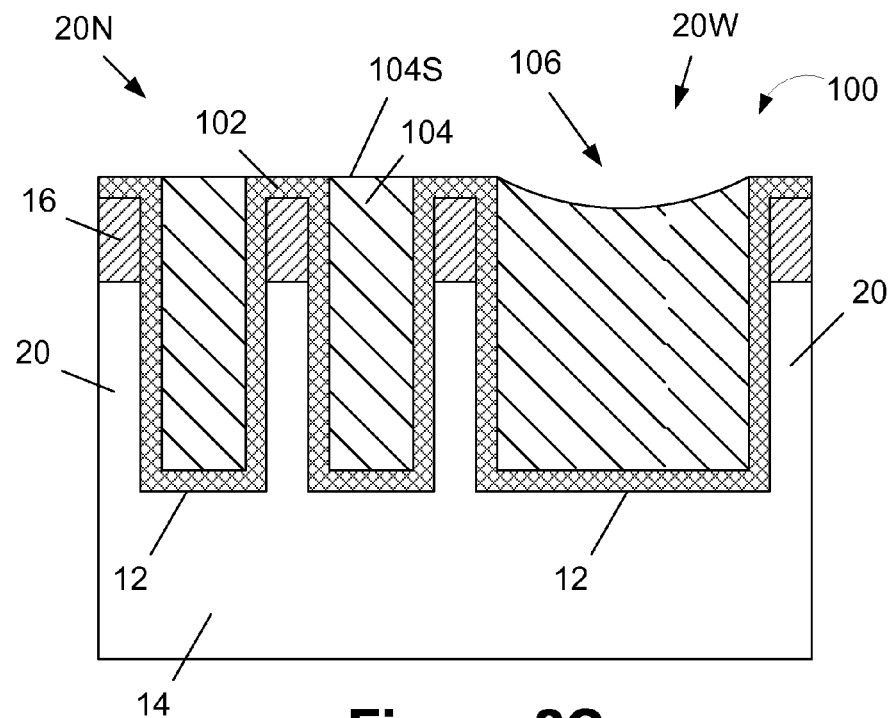

FIG. 2C depicts the product 100 after a layer of insulating material 104 has been deposited so as to overfill the trenches 12 and after a CMP process has been performed on the layer of insulating material 104 in an effort to planarize the upper surface 104S of the layer of insulating material 104. In the depicted example, the CMP process stops on the liner 102. As discussed previously, as a result of the relatively wider fin pitch in the area 20W, there may be more undesirable dishing 106 in the region 20W than in the region 20N having the narrower fin pitch. The layer of insulating material 104 may be comprised of a variety of different materials, such as silicon dioxide, doped silicon dioxide (doped with carbon, boron or phosphorous), etc., and it may be formed by performing a variety of techniques, e.g., chemical vapor deposition (CVD), etc. Instead of a CMP process, an etch-back process could be performed on the layer of insulating material 104 to arrive at substantially the same structure as depicted in FIG. 2C.

Figure 2D:
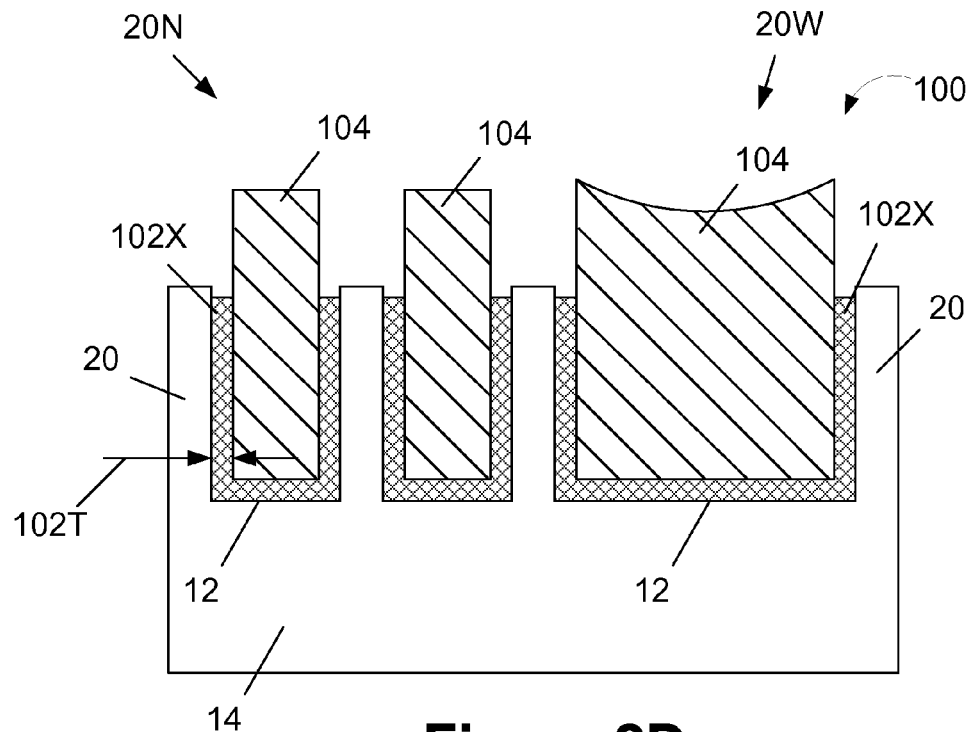
Figure 2E:
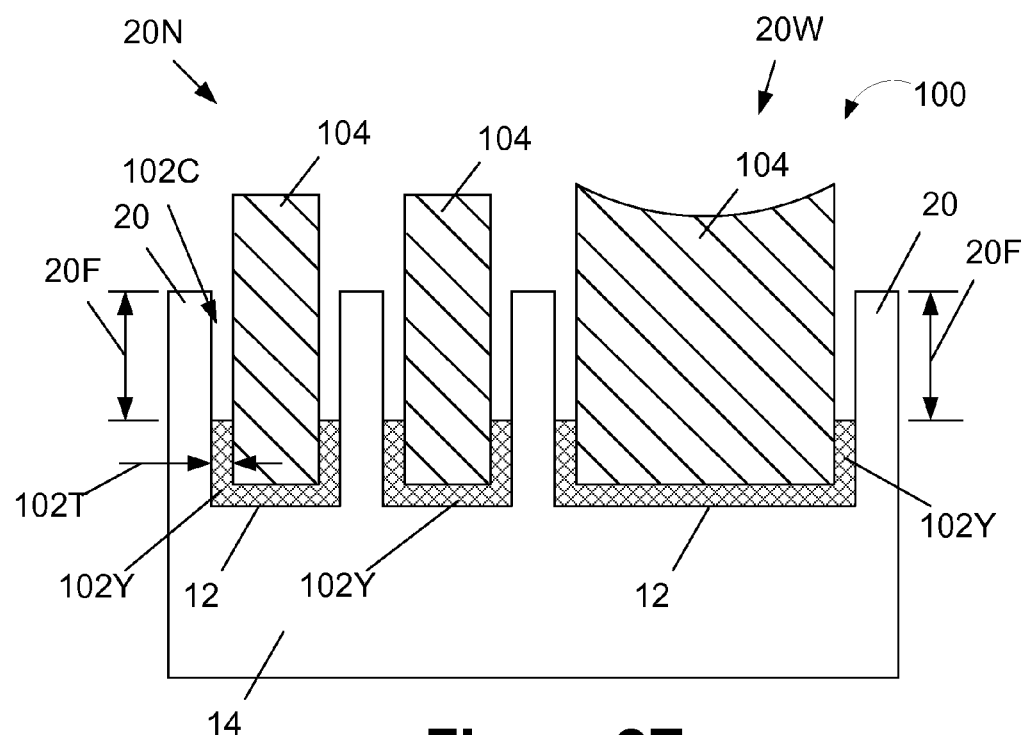

FIGS. 2D-2E show the product 100 after an etching sequence has been performed on the product 100 to recess the liner 102 within the trenches 12. Initially, if desired, an optional oxide deglaze etching process may be performed to insure that all of the insulating material 104, e.g., silicon dioxide, is removed from the upper surfaces of the liner 102. Thereafter, an etching process is performed to remove the patterned hard mask 16 and the liner 102 selectively relative to the insulating material 104. FIG. 2D depicts the product 100 at the point where the etching process has removed portions of the liner 102 and the patterned hard mask 16. The reference number 102X is used to depict the liner 102 at this point in the recess etching process. FIG. 2E depicts the product 100 at the end of the etching process wherein the liner 102 has been recessed sufficiently to establish the final exposed fin height 20F of the fins 20. The reference number 102Y is used to depict the liner 102 at this point in the recess etching process.

In general, the etch rate in the above-described liner recess etch process decreases the further (or deeper) the liner 102 is recessed, which provides a means to effectively control the depth of the liner recess. The slowing of the etch process in such a narrow space occupied by the vertically oriented portions of the liner 102 may be referred to as a so-called capillary effect. It should also be noted that the control of the fin height 20F is not dependent upon the fin pitch in different regions of the product, since the thickness 102T of the liner 102 is the same in all regions, irrespective of fin pitch. Thus, the liner 102 may be recessed to the same depth across the product 100, which results in a substantially uniform fin height 20F across the product 100. In general, the greater the thickness 102T of the conformal liner 102, the greater will be the resulting substantially uniform fin height 20F across the substrate. Stated another way, increasing the thickness 102T of the liner 102 means that the cavity 102C above the liner 102 during the recess etch process is wider, which does not slow the etch rate of the recess etch process as much as a narrower cavity 102C that results from the use of a thinner liner 102. By selecting the appropriate target thickness 102T (either a specific number or a range) of the liner 102, the target final fin height 20F for all fins across the substrate and within a particular FinFET device may be set and controlled using the methods disclosed herein. For example, using the methods disclosed herein, setting the target thickness 102T of the liner 102 at values A, B and C results in a product 100 having a substantially uniform final fin height 20F of X, Y and Z, respectively, across the substrate. The relationship between the liner thickness 102T and the final fin height 20F may vary depending upon a variety of factors, e.g., the materials used for the liner 102, the etchants used in the recess etch process, the geometry of the trench 12, etc. Moreover, the relationship between the liner thickness 102T and the final fin height 20F may not be linear. Accordingly, it is anticipated that, in implementing the present inventions, testing may be required to establish the exact parameters of, for example, liner material, liner thickness and etching process conditions and materials to arrive at a solution tailored for a particular product 100.

Figure 2F:
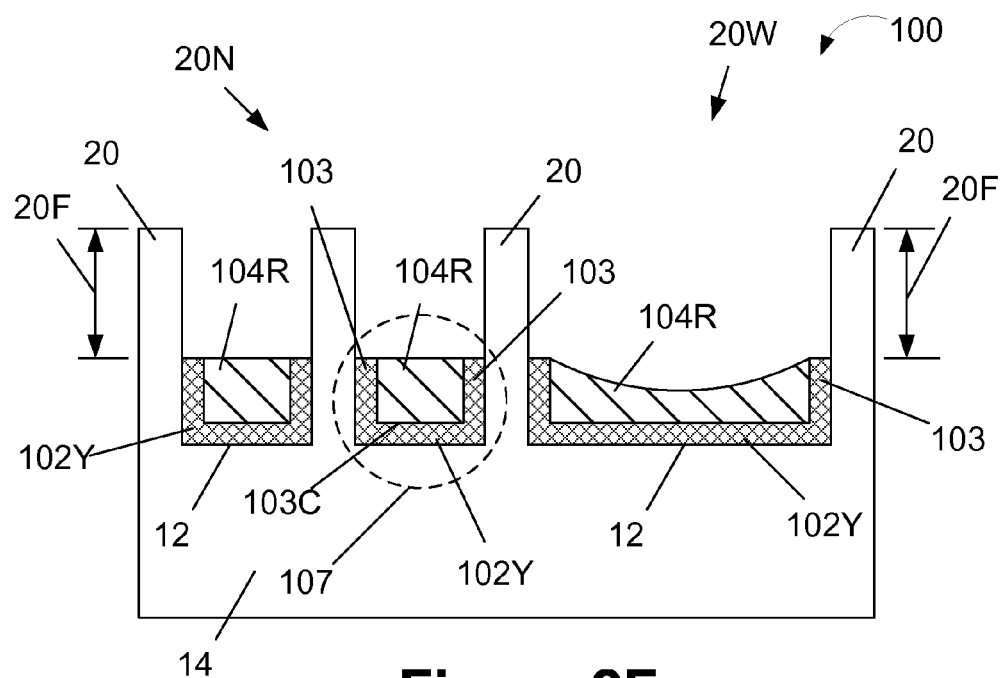

FIG. 2F depicts the product 100 at a point in fabrication wherein a timed etching process has been performed on the layer of insulating material 104 to reduce its thickness and thereby define a reduced-thickness layer of insulating material 104R. This process results in the formation of local isolation regions 107 in the bottom of the trenches 12. The local isolation region 107 is generally comprised of a generally "U" shaped liner 102Y with a pair of spaced-apart substantially upstanding or vertical leg portions 103 that are connected by a substantially horizontal portion of the liner 102Y, and a portion of the layer of insulating material 104R positioned in the cavity 103C defined, in part, by the upstanding leg portions 103 of the liner 102Y. The same basic structure of the local isolation region 107 is present in both of the regions 20N and 20W.

Figure 2G:
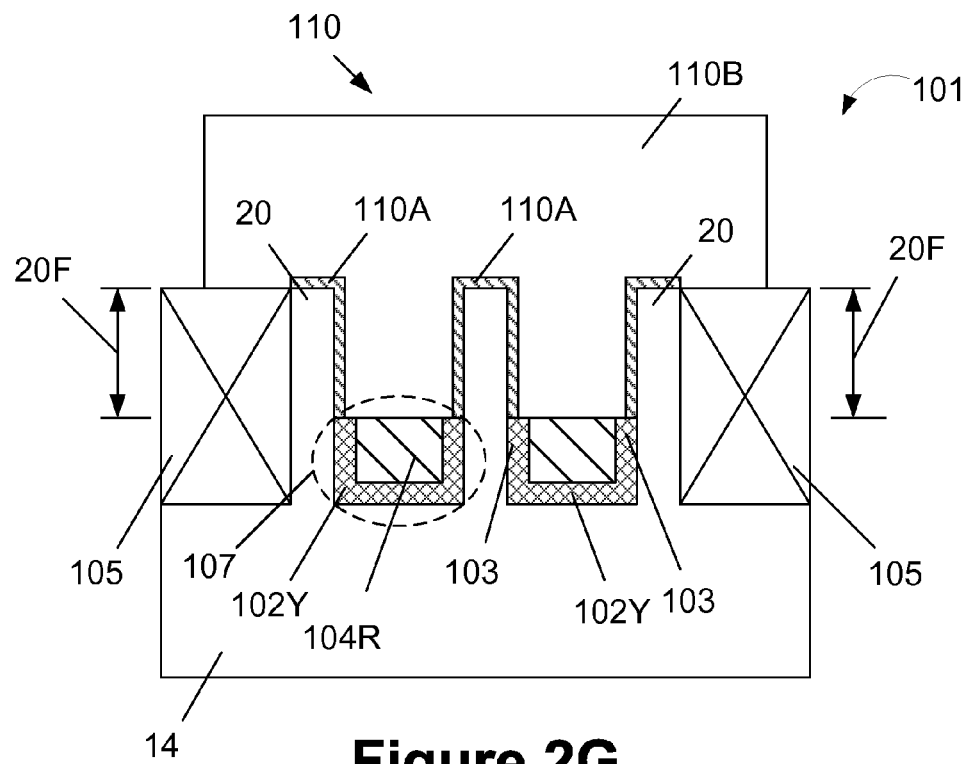

FIG. 2G is a depiction of a single FinFET device 101 that may be formed using the methods disclosed herein. An illustrative device isolation region 105, e.g., a shallow trench isolation region, is formed in the substrate 14 using traditional techniques. The device 101 includes a plurality of fins 20 having a final fin height 20F, a plurality of trenches having local isolation regions 107 formed therein and a final gate structure 110 comprised of an illustrative gate insulation layer 110A and an illustrative gate electrode 110B. The final gate structure 110 may be formed using so-called "gate-first" or "replacement-gate" ("gate-last") techniques. An illustrative gate cap layer (not shown) may also be formed above the illustrative gate electrode 110B. The gate insulation layer 110A may be comprised of a variety of different materials, such as, for example, silicon dioxide, a so-called high-k (k greater than 10) insulation material (where k is the relative dielectric constant), etc. The thickness of the gate insulation layer 110A may also vary depending upon the particular application, e.g., it may have a thickness of about 1-2 nm. Similarly, the gate electrode 110B may also be of a variety of conductive materials, such as polysilicon or amorphous silicon, or it may be comprised of one or more metal layers that act as the gate electrode 110B. As will be recognized by those skilled in the art after a complete reading of the present application, the gate structure 110 of the device 101 depicted in the drawings, i.e., the gate insulation layer 110A and the gate electrode 110B, is intended to be representative in nature. That is, the gate structure 110 may be comprised of a variety of different materials and it may have a variety of configurations. In one illustrative embodiment, a thermal oxidation process may be performed to form the depicted gate insulation layer 110A comprised of silicon dioxide. Thereafter, the gate electrode material 110B and the gate cap layer material (not shown) may be deposited above the device 101 and the layers may be patterned using known photolithographic and etching techniques. In another illustrative embodiment, a conformal CVD or ALD process may be performed to form a gate insulation layer 110A comprised of hafnium oxide. Thereafter, one or more metal layers (that will become the gate electrode 110B) and a gate cap layer material (not shown), e.g., silicon nitride, may be deposited above the device 101. At this point, traditional manufacturing techniques may be performed to complete the manufacture of the device 101. For example, sidewall spacers (not shown) comprised of, for example, silicon nitride, may be formed adjacent the final gate structure 110. After the spacers are formed, if desired, an epitaxial growth process may be performed to form additional semiconducting material (not shown) on the portions of the fins 20 positioned outside of the spacers. Additional contacts and metallization layers may then be formed above the device using traditional techniques.

Figure 2H:
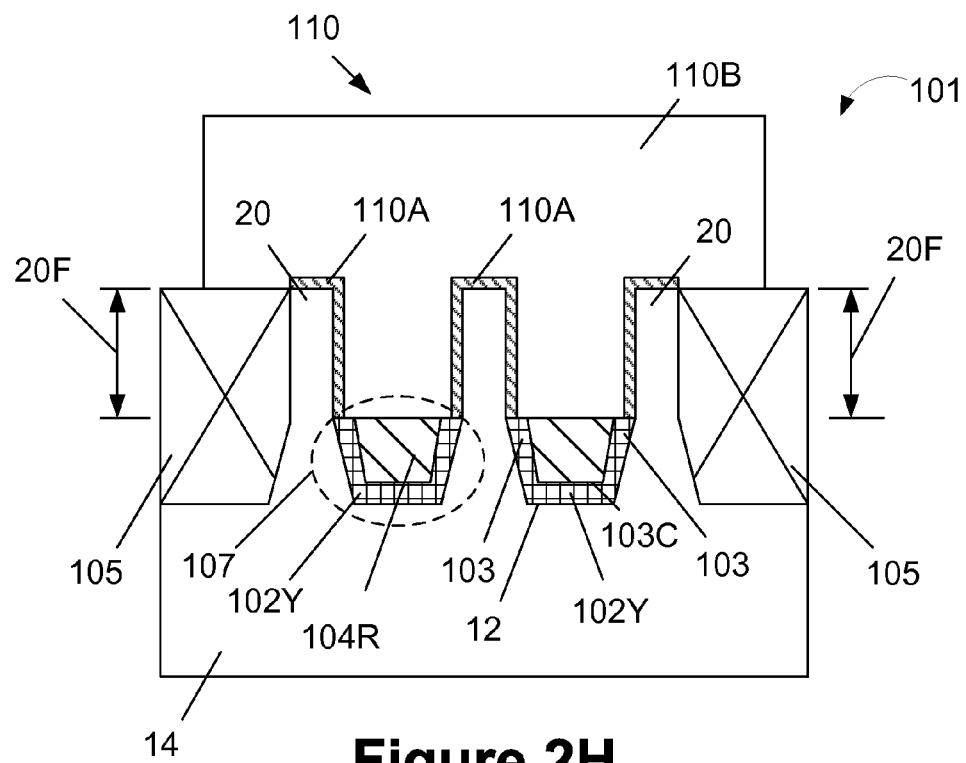
Figure 2I:
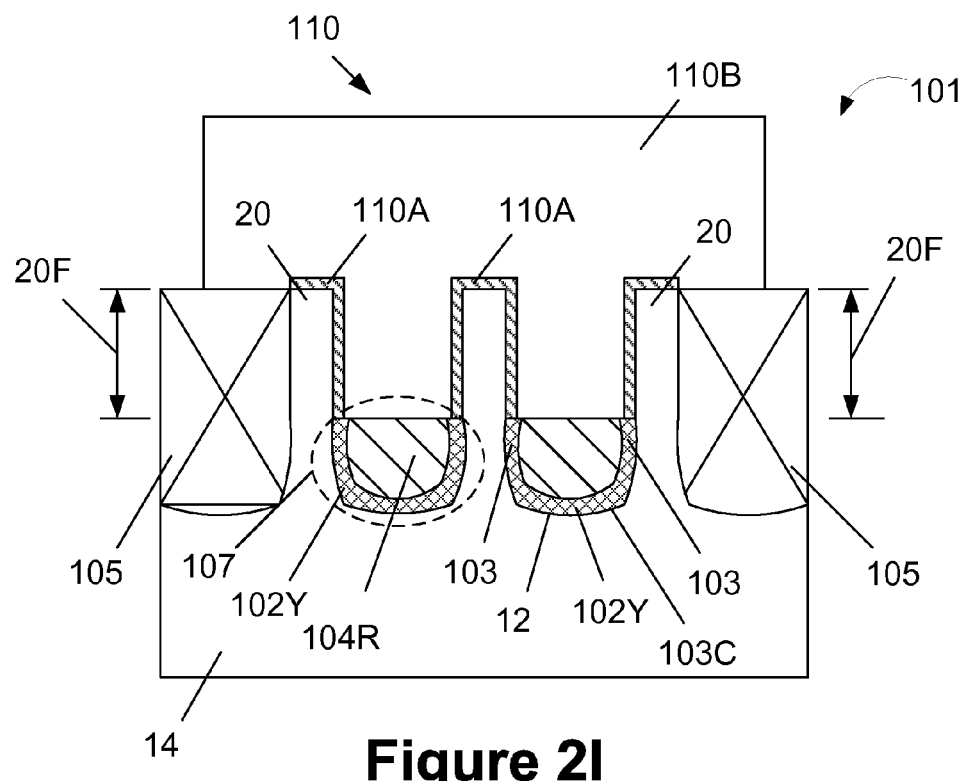

FIGS. 2H and 2I provide illustrative examples where the trenches 12 have a more tapered or more rounded configuration, respectively. Nevertheless, a generally U-shaped local isolation region 107 is formed in the bottom of the devices with such variations in the configuration of the bottom portions of the trenches. In both of the situations depicted in FIGS. 2H-2I, the local isolation region 107 is generally comprised of a generally "U" shaped liner 102Y with substantially upstanding or vertical leg portions 103 that are connected by a horizontal portion of the liner 102Y, and a portion of the layer of insulating material 104R positioned in the cavity 103C defined, in part, by the upstanding leg portions 103 of the liner 102Y.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
    forming a patterned hard mask layer above a semiconducting substrate;
    performing at least one first etching process through said patterned hard mask layer to form a plurality of trenches in said semiconducting substrate, said trenches defining a fin;
    forming a conformal liner layer above said patterned hard mask layer and in said trenches;
    forming a layer of insulating material in said trenches above said conformal liner layer;
    performing a process operation to remove portions of said layer of insulating material and to expose portions of said conformal liner layer;
    performing at least one second etching process to remove portions of said conformal liner layer and said patterned hard mask layer, wherein said second etching process results in a generally U-shaped liner positioned at a bottom of each of said plurality of trenches;
    performing at least one third etching process on said layer of insulating material to thereby define a reduced-thickness layer of insulating material, wherein at least a portion of said reduced-thickness layer of insulating material is positioned within a cavity defined by said generally U-shaped liner layer; and
    forming a gate structure around a portion of said fin.

2. The method of claim 1, wherein said patterned hard mask layer and said conformal liner layer are comprised of silicon nitride and said layer of insulating material is comprised of silicon dioxide.

3. The method of claim 1, wherein performing said process operation comprises performing a chemical mechanical polishing process operation.

4. The method of claim 1, wherein said semiconducting substrate is comprised of silicon.

5. The method of claim 1, wherein said generally U-shaped liner layer comprises a plurality of spaced-apart generally upstanding substantially vertically oriented legs.

6. The method of claim 1, wherein the entirety of said reduced-thickness layer of insulating material within each of said trenches is positioned entirely within said cavity in said generally U-shaped liner.

7. The method of claim 1, wherein said gate structure is comprised of a silicon dioxide gate insulation layer and a polysilicon gate electrode positioned above said gate insulation layer.

8. The method of claim 1, wherein said gate structure comprises a gate insulation layer comprised of a high-k insulating material and a gate electrode comprised of at least one layer of metal.

9. The method of claim 1, wherein said trenches have at least one of substantially vertical sidewalls, sloped sidewalls or curved sidewalls.

10. A method of forming a FinFET device having a target final fin height, comprising:
    forming a patterned hard mask layer above a semiconducting substrate;
    performing at least one first etching process through said patterned hard mask layer to form a plurality of trenches in said semiconducting substrate, said trenches defining a fin;
    selecting, based upon said target final fin height, a target thickness for a conformal liner layer to be formed above said patterned hard mask layer and in said trenches;
    forming said conformal liner layer having said target thickness above said patterned hard mask layer and in said trenches;
    forming a layer of insulating material in said trenches above said conformal liner layer;
    performing a process operation to remove portions of said layer of insulating material and to expose portions of said conformal liner layer;
    performing at least one second etching process to remove portions of said conformal liner layer and said patterned hard mask layer, wherein said second etching process results in a generally U-shaped liner positioned at a bottom of each of said trenches and wherein said substantially U-shaped liner exposes a portion of said fin that corresponds to said final desired fin height;
    performing at least one third etching process on said layer of insulating material to thereby define a reduced-thickness layer of insulating material; and
    forming a gate structure around a portion of said fin having said final desired fin height.

11. The method of claim 10, wherein performing said process operation comprises performing a chemical mechanical polishing process operation.

12. The method of claim 10, wherein said generally U-shaped liner layer comprises a plurality of spaced apart generally upstanding vertically oriented legs.

13. The method of claim 10, wherein the entirety of said reduced-thickness layer of insulating material within each of said trenches is positioned entirely within a cavity in said generally U-shaped liner.

* * * * *